United States Patent [19]
Robillard

[11] 4,005,288
[45] Jan. 25, 1977

[54] PHOTODETECTOR MOUNTING AND CONNECTING

[75] Inventor: Gene A. Robillard, Stoneham, Mass.

[73] Assignee: Honeywell Inc., Minneapolis, Minn.

[22] Filed: Sept. 19, 1975

[21] Appl. No.: 614,804

[52] U.S. Cl. .............................. 250/239; 250/352
[51] Int. Cl.² ......................................... H01J 5/02
[58] Field of Search .......... 250/239, 352; 29/25.13, 29/628

[56] References Cited
UNITED STATES PATENTS

| | | | |
|---|---|---|---|
| 3,719,990 | 3/1973 | Long et al. | 29/628 |
| 3,851,173 | 11/1974 | Taylor et al. | 250/352 |
| 3,942,010 | 3/1976 | Peterson et al. | 250/352 |

*Primary Examiner*—David C. Nelms
*Attorney, Agent, or Firm*—David R. Fairbairn

[57] ABSTRACT

An improved method for providing electrical connection to a photodetector in a Dewar flask is disclosed. A plurality of conductive paths are formed on the inner flask of the Dewar. Each of the conductive paths extends from the side surface on to the top surface of the inner flask. A photodetector having lead tabs is mounted to the top surface of the inner flask with the lead tabs aligned with the conductive paths. The lead tabs are bonded to the conductive paths to provide electrical connection to the photodetector.

2 Claims, 18 Drawing Figures

PHOTODETECTOR MOUNTING AND CONNECTING

REFERENCE TO CO-PENDING APPLICATIONS

Reference is made to co-pending applications by G. A. Robillard entitled "Electrical Conductors for Dewar Flask", Ser. No. 614,805, and by G. J. Burrer and G. A. Robillard entitled "Improved Lead Throughs for Dewar Flasks", Ser. No. 614,803, which were filed on even date with this application and were assigned to the same assignee as this application.

BACKGROUND OF THE INVENTION

This invention relates to cooled photodetector apparatus. In part, the present invention is a method of providing electrical connection to a photodetector in a Dewar type flask.

Infrared photodetectors have to be operated at low temperatures in order to obtain improved detector performance. The detectors are typically mounted in a double flask of the Dewar type. A Dewar flask consists of an inner flask or "bore" and an outer flask. The infrared detectors are mounted in thermal contact with the top surface of the inner flask, which is cryogenically cooled. Since the detectors are in thermal contact with the inner flask, the detectors operate at the cryogenic temperature.

Because the detectors are typically operated at low temperatures and in a vacuum, electrical connection between each of the detectors in the evacuated portion of the Dewar and the outside Dewar is rather complex. The fabrication techniques used to mount detectors in a Dewar and to provide electrical connection from the detectors to the outside of the Dewar typically involve a large number of hand or manual fabrication steps. These manual fabrication steps are time consuming, tedious, expensive, and generally unsatisfactory.

One typical method of forming electrical conductors in a Dewar is to form electrodes by embedding wires in glass cylinders or tubes and then sealing the tubes to the side of the inner flask. A reflective film is then typically deposited over the inner surfaces and the tubes to reduce heat load in the flask.

The next step in this prior art technique is to attach the photodetectors to a circuit board, which is, in turn, attached to the top of the inner flask. Electrical connections are then made from each of the wires which are embedded in the glass tubes to an electrode on the circuit board. This electrical connection is usually made by a thin diameter wire. Connection is then made to the detector by bonding an additional wire, usually gold, to a metal film on the detector and attaching the opposite end to the PC board electrode.

This prior art technique has a number of disadvantages. First, each of the embedded wires must be inserted in a glass tube and each glass tube must then individually be attached to the side of the inner flask. This process is generally done by hand and is quite time-consuming.

Second, the technique generally requires a circuit board mounted on the top of the inner flask. This results in additional fabrication steps and additional elements in the Dewar which must be cooled.

Third, the outside surface of the inner flask becomes irregular because of the attached tubes. It is not possible, therefore, to conveniently attach a cold shield directly to the outside diameter of the inner flask. Instead, the cold shield must be attached to and/or around the circuit board.

Fourth, the bonding of individual wires between each embedded wire and a detector involves time-consuming manual operations. In addition, the technique requires making a bond to a thin metal film directly on the detector in order to attach the thin wire. The bonding process can cause some heating of the detector, which can adversely affect the detector's performance.

Other techniques for forming electrical conductors on the side of the inner flask have been suggested. For example, silver stripes have been hand painted on the side and top of the inner flask to provide electrical conductive paths. This technique, however, is very unsatisfactory when a large number of detectors are to be mounted in one Dewar.

Another technique is to apply silver decals on the side of the inner flask. This technique also is unsatisfactory because it requires manual dexterity to make connections to the stripes.

Still another technique was suggested by J. J. Long et al in U.S. Pat. No. 3,719,990. In this technique, silver is deposited on the side of the inner flask. The silver is then indexed and scribed, and finally etched to define silver stripes extending on the side of the surface. While this technique eliminates some of the manual operations required by other prior art techniques, it does not eliminate the need for interconnection wires between each of the silver stripes on the side of the flask and each detector.

SUMMARY OF THE INVENTION

The present invention is a method of providing electrical connection to a photodetector in a photodetector mounting apparatus such as a Dewar type flask. The photodetector is provided with electrical leads having a part attached to the photodetector and another part projected from the photodetector. A plurality of conductive paths are formed on the inner flask of the mounting apparatus. The conductive paths extend from the side surface on to the top surface of the inner flask. The photodetector is mounted on the top surface of the inner flask with at least one of the electrical leads aligned with one of the conductive paths. Electrical connection is provided by bonding the electrical lead to the conductive path.

DETAILED DESCRIPTION OF THE PREFERRED EMBODIMENTS

Figure 1:
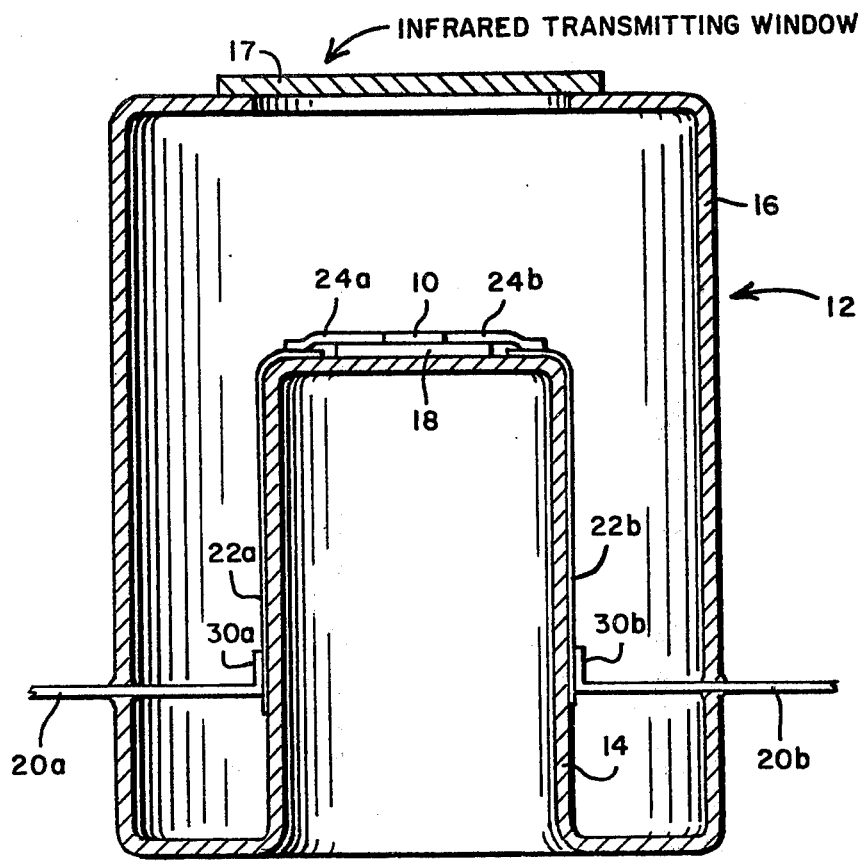
FIG. 1 shows a cooled photodetector system having electrical connections formed by the method of the present invention.

FIG. 1 shows a partial cross-sectional view of a photodetector system formed by the method of the present invention. The system includes a photodetector 10 mounted in a cryogenic cooling apparatus such as a Dewar flask 12. Dewar flask 12 includes an inner flask 14 and an outer flask 16. An infrared transmitting window 17 is attached to outer flask 16.

Photodetector 10 is mounted on substrate 18 which is, in turn, mounted on the top surface of inner flask 14. Electrical connection from the outside of the Dewar flask 12 to photodetector 10 is provided by lead-throughs 20a and 20b, which are connected to conductive paths 22a and 22b, respectively. Detector lead tabs 24a and 24b contact detector 10 and are bonded to conductors 22a and 22b, respectively.

As shown in FIG. 1, lead-throughs 20a and 20b project inwardly through the side of outer flask 16 toward inner flask 14 in a direction which is essentially normal to the side surface of inner flask 14. Each lead-through is provided with a contact portion 30a and 30b, respectively, which is proximate the inner flask 14 and essentially parallel to the side surface of inner flask 14. Contact portions 30a and 30b, when aligned with conductors 22a and 22b, can quickly be bonded by thermocompression bonding or welding to provide electrical connection between lead-throughs 20a and 20b and conductors 22a and 22b. This procedure can be performed automatically or with a minimum of manual operations, thus reducing fabrication costs.

Figure 2:
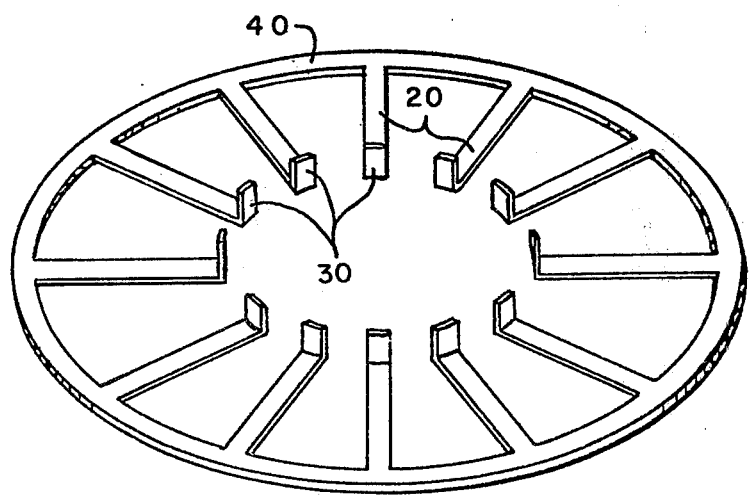
FIG. 2 shows electrical lead-throughs with a supporting rim and contact portions for use in a Dewar flask.

FIG. 2 shows a preferred means of providing lead-throughs for a Dewar flask. A plurality of lead-throughs 20, each having a contact portion 30, are provided with a supporting rim 40. The lead-throughs are encapsulated in glass outer flask 16 in a method similar to that shown in U.S. Pat. No. 3,719,990 by J. J. Long et al. Once the lead-throughs are fused into a portion of outer flask 16, supporting rim 40 is removed so that each lead-through is a separate electrical conductor.

Figure 3:
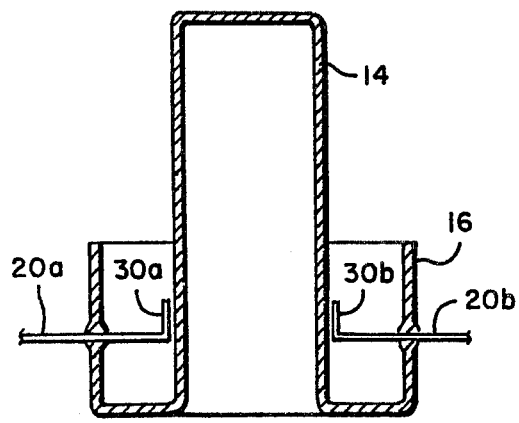
FIGS. 3, 4, 5a, 5b, and 6 show the formation of electrical conductive paths in a Dewar flask according to the present invention.

FIG. 3 shows the two lead-throughs 20a and 20b having the contact portions 30a and 30b which have been fused into a portion of outer flask 16. In FIG. 3, inner flask 14 has no conductors on its side or top surfaces.

Figure 4:
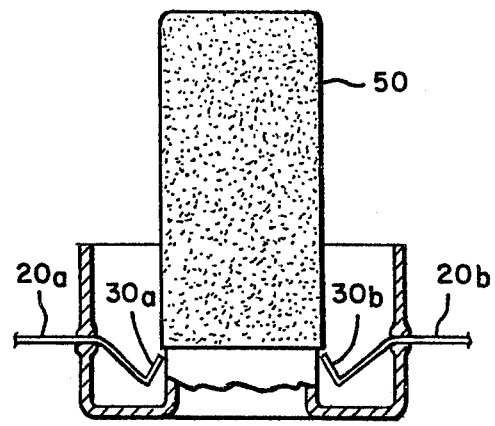

In FIG. 4, a thin metal film 50 has been deposited over the side and top surfaces of inner flask 14. During this process, the contact portions 30a and 30b of lead-throughs 20a and 20b have been drawn out of their normal position with respect to the side surface of inner flask 14. This allows thin film 50 to be deposited under the normal positions of contact portions 30a and 30b. Contact portions 30a and 30b may be drawn out of their normal position by a mechanical fixture which applies pressure to them or by a magnetic field if lead-throughs 20a and 20b are magnetic material such as an iron-nickel alloy.

Metal film 50 is preferably deposited by a vapor deposition technique such as vacuum or sputter depositing. Vapor deposition is preferred over other deposition techniques since it provides a convenient method of depositing film 50 not only on the side but also on the top surface of inner flask 14.

In the preferred embodiments of the present invention, metal film 50 is a multi-layer metal film. One preferred metal film has a first layer of chromium having a thickness of about 500A to 1000A and a second layer of gold overlaying the chromium. The gold layer has a thickness of between 4000A and about 8000A. The chromium is selected as the layer in contact with the glass of Dewar 14 because it has good adherence to glass over the temperature range of interest. The gold is deposited over the chromium to provide the desired resistance of the film and provide an oxide free electrode for interconnect purposes.

In another preferred embodiment, film 50 is a three layer metal film. The first layer is titanium, the second layer is platinum, and the third layer is gold. The first layer preferably has a thickness of about 1000A, the second layer has a thickness of about 3000A, and the third layer has a thickness of about 5000A.

In the preferred embodiments, the outer layer of metal film, gold, may be vapor deposited and then electroplated to increase thickness, if necessary. Alternatively, the outer layer may be just electroplated, or just vapor deposited.

The particular thickness of metal film 50 depends upon two somewhat conflicting criteria. First, film 50 should have high electrical conductivity since it will form the electrical conductive paths from the lead-throughs to the detectors. Second, metal film 50 should have as low a thermal conductivity as possible. In view of these criteria, the film thickness will depend on the length and width of each electrode, the desired resistance and heat load.

Figure 5B:
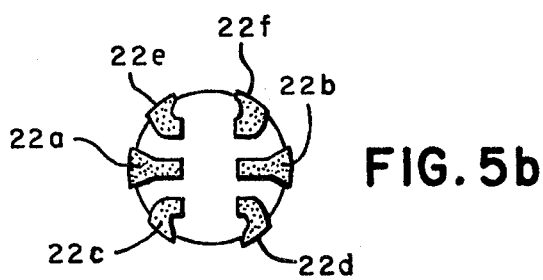
Figure 5A:
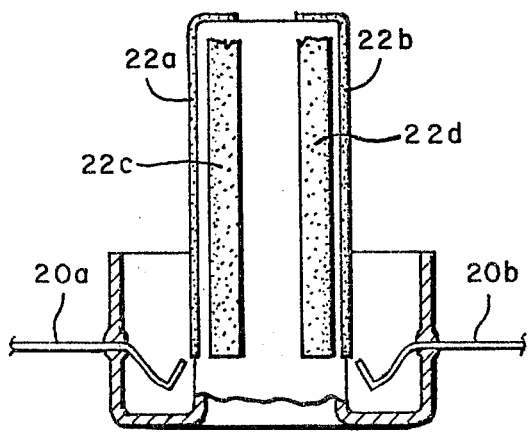

After metal film 50 has been deposited on the top and side surfaces of inner flask 14, portions of the metal film are selectively removed to provide electrical conductive paths extending from the side on to the top of inner flask 14. FIGS. 5a and 5b show side and top views of conductive paths 22 which have been formed by selective removal of portions of film 50.

As shown in FIGS. 5a and 5b, conductive paths 22 extend from the side to the top of inner flask 14. Each conductive path is aligned with respect to the normal position of one of the contact portions 30 of lead-throughs 20.

In the preferred embodiments of the present invention, the selective removal of the metal film 50 is performed by standard photolithographic techniques and etching. These techniques can be performed on an essentially automatic basis. The particular etches used will, of course, depend upon the particular metal or metals comprising metal film 50.

Figure 6:
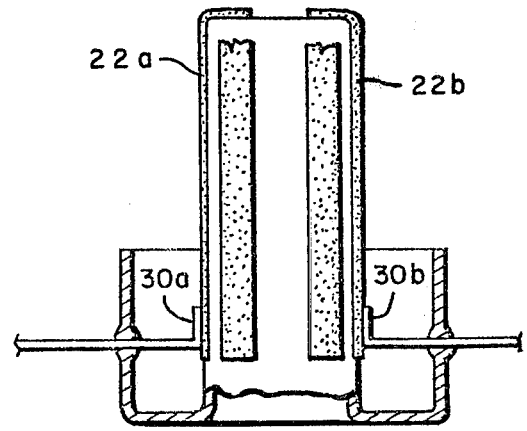

As shown in FIG. 6, after conductive paths 22 have been formed, contact portions 30 of lead-throughs 20 are allowed to assume their normal positions. This places a contact portion 30 of a lead-through 20 essentially in contact with one of the conductive paths 22. Each contact portion is then bonded to one of the conductive paths. This bonding can be performed on an automatic or semi-automatic basis using thermocompression bonding or welding.

For the purposes of illustration, in FIGS. 5a, 5b, and 6, six conductive paths, 22a–f, are shown. These six conductive paths, 22a–f, provide electrical connection for three detectors. It is understood that the number of conductors and the particular configuration of the conductive paths will depend upon the number and desired arrangement of detectors on the top surface of inner flask 14. Also, for ease of illustration, the space between individual conductive paths has been exaggerated. In the preferred embodiments of the present invention, the spacing between individual conductors 22 is very small, so that metal film 50 covers nearly all of the side surface of inner flask 14. In this manner, conductive paths 22 also act as a reflective film to reduce heat load in the Dewar.

Figure 7:
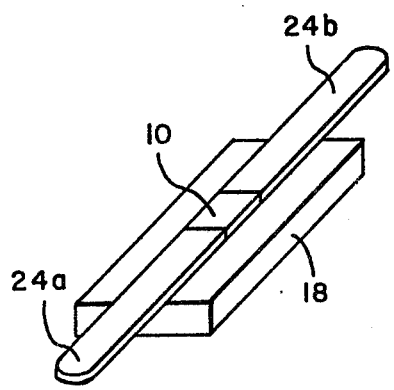
FIG. 7 shows a photodetector having lead tabs.

The conductive paths which extend from the side on to the top of the inner flask are particularly advantageous when used in conjunction with a detector having "lead tabs." Such a detector is shown in FIG. 7. Detector 10 has attached to it electrical lead tabs 24a and 24b. Each lead tab has a part which is attached to detector 10 and another part attached to the substrate 18 and projects from detector 10 and substrate 18.

Figure 8:
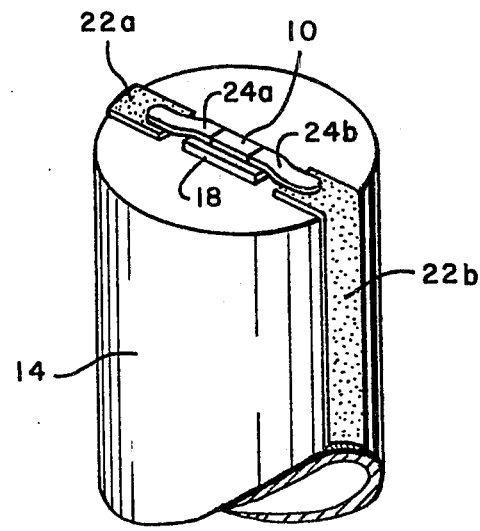
FIG. 8 shows the photodetector of FIG. 7 mounted on the top of the inner flask.

FIG. 8 shows the detector of FIG. 7 mounted on the top surface of inner flask 14. Detector 10 and substrate 18 are attached directly to the glass top surface of inner flask 14. Each electrical lead tab 24a and 24b is aligned with one of the conductive paths 22a and 22b during mounting. Lead 24a is then bonded to conductive path 22a and lead 24b is bonded to conductive path 22b. Although only one detector is shown in FIG. 8, it is understood that a plurality of detectors may be mounted on the top surface of inner flask 14 in a similar manner.

This technique has several advantages. First, it reduces the number of manual operations required to form electrical connection between the detector and the conductive paths. In the prior art, a bond was made between a conductive path and a thin gold wire. This gold wire was then extended from the conductive path to the detector and was bonded to the detector. Alternatively, sometimes the wire was attached between the conductive path and a circuit board. Another wire was then attached between the circuit board and the detector. The present invention, therefore, eliminates at least half of the bonds required by the prior art.

Second, it allows the bond to be made at a position which is somewhat remote from the detector itself. This is an important advantage for photodetector material which can be adversely affected by heat and pressure used for bonding.

Third, it allows detector 10 and substrate 18 to be mounted directly on the top surface of inner flask 14. The prior art technique generally requires attaching a circuit board to the top of the inner flask. The substrate and detector are then bonded to the circuit board. This causes additional fabrication steps to be performed and requires cooling of additional elements within the Dewar.

Fourth, a cold shield (not shown) can be directly attached to the side surface of inner flask 14, provided that the cold shield is an electrical insulator such as a ceramic or has a dielectric coating. The cold shield can be attached to the surface of inner flask 14 because the surface, even with conductors 22, is essentially regular. In contrast, the prior art devices using embedded wires in glass cylinders caused the side surface of inner flask 14 to be wavy or irregular. It is difficult to attach a cold shield on a reliable basis to an irregular surface like that used in the prior art.

Fifth, the lead tab is relatively immune to side movement, making it easy to align the leads over conductors 22. This allows bonding of all leads in one quick operation.

Figure 9A:
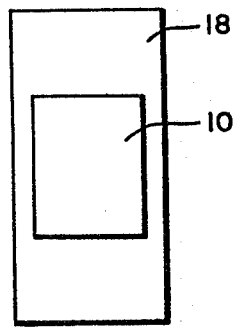
FIGS. 9a through 9f show a method of forming lead tabs for a photodetector.

FIGS. 9a through 9f show a preferred method for forming lead tabs to detector 10. In FIG. 9a, detector 10 is attached to substrate 18. Detector 10 may be, for example, a mercury cadmium telluride photoconductive detector. Substrate 18 is preferably sapphire having a thickness of about 0.005 inches.

Figure 9B:
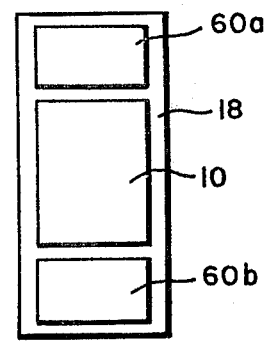

In FIG. 9b, multi-layer chromium-gold or titanium-platinum-gold films 60a and 60b have been deposited at opposite ends of substrate 18. Films 60a and 60b do not contact detector 10.

Figure 9C:
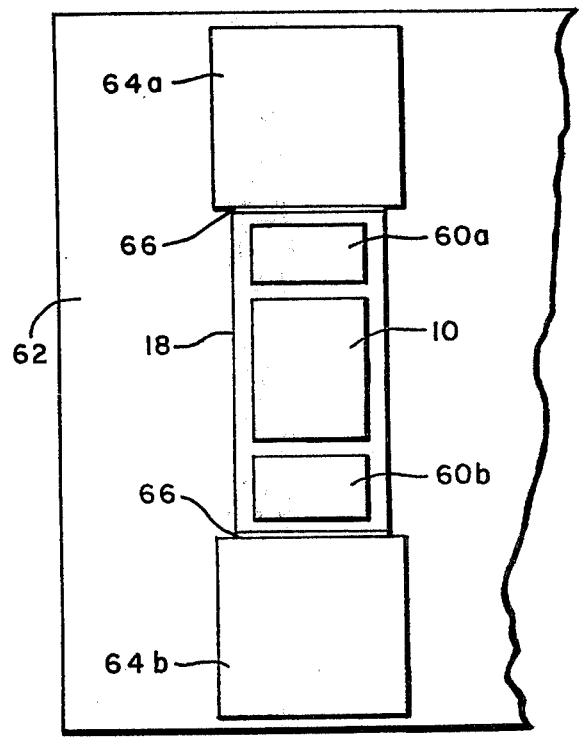

In FIG. 9c, substrate 18, with detector 10 and films 60a and 60b, is mounted on backing block 62. Positioned adjacent to the ends of substrate 18 are temporary or "dummy" carriers 64a and 64b. These dummy carriers 64a and 64b have the same height as substrate 18. Filler 66 fills the cracks between substrate 18 and dummy carriers 64a and 64b, and is level with dummy carriers 64a and 64b and with substrate 18. Filler 66 may be a rinse away filler such as bees wax, photolithographic resist or a releasable adhesive such as Dow Corning Silastic 3016.

Figure 9D:
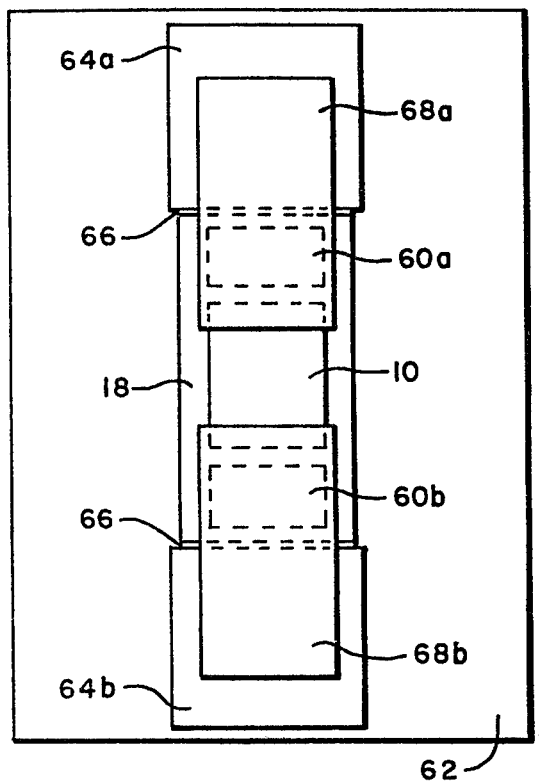

In FIG. 9d, metal layers 68a and 68b are deposited across dummy carriers 64a and 64b, substrate 18, metal films 60a and 60b, and on to photodetector 10. In one preferred embodiment, layers 68a and 68b are vacuum deposited indium-gold or palladium-gold.

Figure 9E:
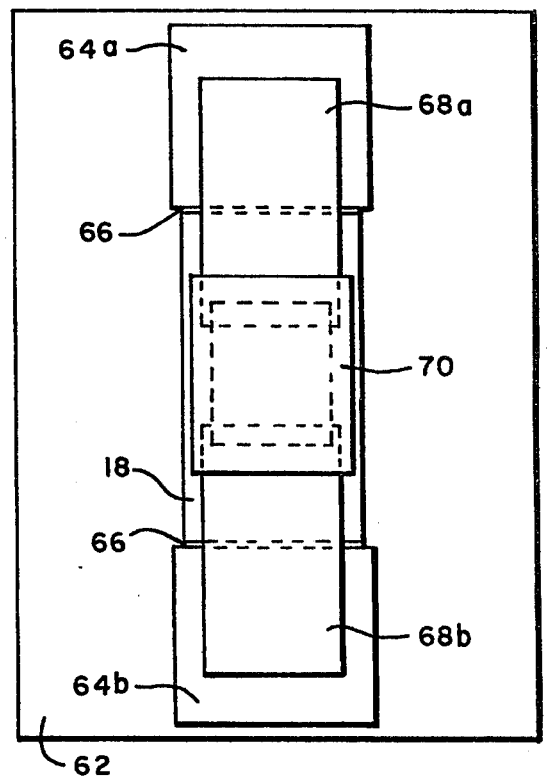

In FIG. 9e, photoresist layer 70 is formed over detector 10 and on to part of substrate 18 and layers 68a and 68b. Temporary electrodes or probes (not shown) are then attached to metal layers 68a and 68b, and gold is electroplated on to the exposed portion of layers 68a and 68b. The thickness of the exposed metal layers 68a and 68b is, therefore, built up to form lead tabs 24a and 24b.

Figure 9F:
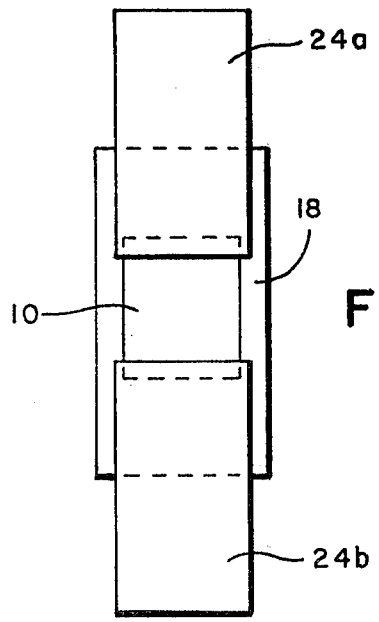

Finally, as shown in FIG. 9f, backing block 62, dummy carriers 64a and 64b, and photoresist 70 are removed, leaving detector 10 mounted on substrate 18 with lead tabs 24a and 24b which extend from detector 10 across and beyond substrate 18.

Figure 10A:
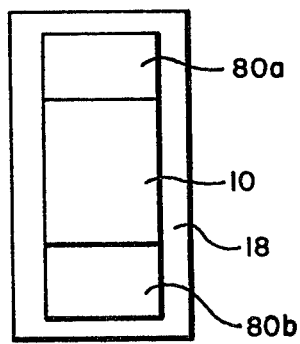
FIGS. 10a through 10c show another method for forming lead tabs for a photodetector.
Figure 10B:
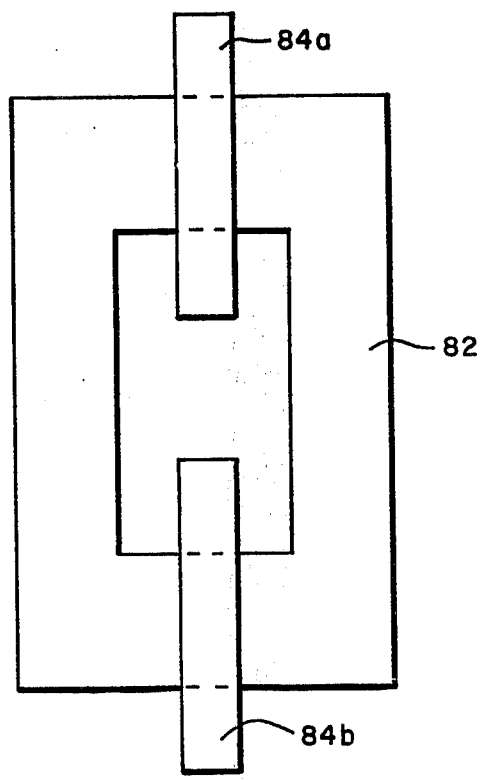
Figure 10C:
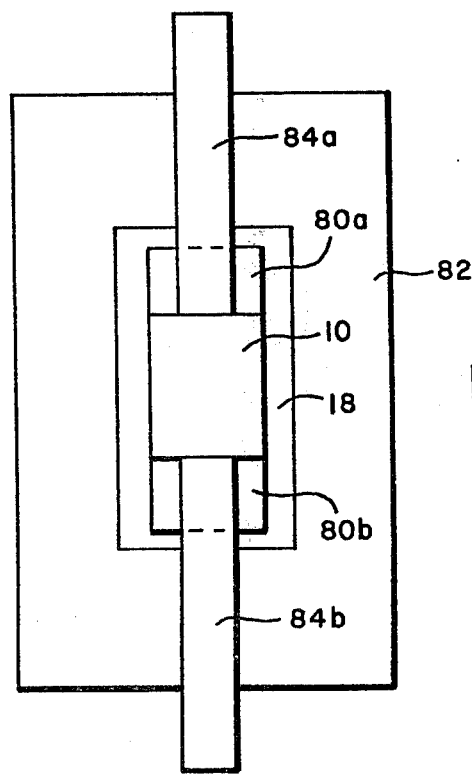

FIGS. 10a through 10c show an alternative technique for forming lead tabs. In FIG. 10a, detector 10 is mounted on substrate 18. Metal layers 80a and 80b are in contact with detector 10 and extend down onto substrate 18.

FIG. 10b shows a second substrate 82 having connected to it lead tabs 84a and 84b. Second substrate 82 has a hole which is exactly the shape and size of substrate 18. Second substrate 82 has a height which is approximately the same as substrate 18.

Lead tabs 84a and 84b extend beyond the outer edge of second substrate 82 and also into the hole in substrate 82. The length of the extension into the hole in substrate 82 is selected so that lead tabs 84a and 84b are aligned with contacts 80a and 80b when second substrate 82 is positioned over substrate 18, as shown in FIG. 10c. Lead tabs 84a and 84b are bonded to contacts 80a and 80b by conventional bonding techniques such as thermocompression bonding and welding.

The advantages of the techniques shown in FIGS. 9 and 10 are that neither technique requires bonding directly over the detector crystal material. This minimizes the chance of degrading the detector because of heat or pressure during the bonding step.

The other important advantage of the techniques shown in FIGS. 9 and 10 is that they greatly reduce the number of manual operations to be performed. Most, if not all, of the steps shown in FIGS. 9 and 10 can be performed on an automatic or semi-automatic basis.

In conclusion, the present invention provides new and highly advantageous techniques for providing electrical connections to photodetectors which are mounted in a Dewar type flask. The present invention greatly reduces the number of manual operations required to be performed, thereby significantly reducing cost and fabrication time and increasing reliability.

Although the present invention has been described with reference to a series of preferred embodiments, workers skilled in the art will recognize that changes in form and detail may be made without departing from the spirit or scope of the present invention.

The embodiments of the invention in which an exclusive property or right is claimed are defined as follows:

1. Photodetector apparatus comprising:
   photodetector mounting apparatus of the Dewar type having an outer flask and an inner flask having top and side surfaces;
   a photodetector mounted on the top surface of the inner flask;
   an electrical conductive path comprising an electrically conductive film extending from the side surface on to the top surface of the inner flask; and
   an electrical lead tab having a first part attached to the photodetector and a second part projecting from the photodetector and having first and second major surfaces, the second part being attached to the electrical conductive path on the top surface of the inner flask, with the first major surface being essentially parallel to and in electrical contact with a surface of the electrical conductive path.

2. The photodetector apparatus of claim 1 and further comprising:
   lead through means projecting through the outer flask and attached to the electrical conductive path on the side surface of the inner flask.

* * * * *